(12) United States Patent
Kawai

(10) Patent No.: US 11,362,208 B2
(45) Date of Patent: Jun. 14, 2022

(54) SEMICONDUCTOR DEVICE HAVING AN INSULATOR BETWEEN SOURCE AND DRAIN REGIONS AND A GATE ELECTRODE HAVING A PORTION THAT COVERS THE INSULATOR AND A PORTION THAT DOES NOT COVER THE INSULATOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hirofumi Kawai, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/551,493

(22) Filed: Aug. 26, 2019

(65) Prior Publication Data

US 2020/0287045 A1 Sep. 10, 2020

(30) Foreign Application Priority Data

Mar. 6, 2019 (JP) .............................. JP2019-040448

(51) Int. Cl.
*H01L 29/78* (2006.01)
*H01L 29/10* (2006.01)
*H01L 29/06* (2006.01)

(52) U.S. Cl.
CPC ...... *H01L 29/7816* (2013.01); *H01L 29/0626* (2013.01); *H01L 29/1045* (2013.01)

(58) Field of Classification Search
None
See application file for complete search history.

(56) References Cited

U.S. PATENT DOCUMENTS 5,386,136 A 1/1995 Williams et al.
5,591,657 A 1/1997 Fujishima et al.
(Continued)

FOREIGN PATENT DOCUMENTS

JP H07-176640 A 7/1995
JP 2007-318158 A 12/2007
(Continued)

*Primary Examiner* — Allen L Parker
(74) *Attorney, Agent, or Firm* — Kim & Stewart LLP

(57) ABSTRACT

A semiconductor device includes a semiconductor substrate having a source region and a drain region, a first insulator between the source region and the drain region, a gate electrode having a first end on a side thereof closer to the source region than the drain region on a portion of the semiconductor substrate that is not covered with the first insulator, and having a second end on the first insulator closer to the drain region than the source region, and a second insulator that is continuous with the second end of the gate electrode and having a portion which is on the first insulator where the first insulator is not covered with the gate electrode, is on an end of the drain region, and is in contact with the gate electrode, the first insulator, and the drain region.

5 Claims, 15 Drawing Sheets

(56) References Cited

U.S. PATENT DOCUMENTS

| | | | |
|---|---|---|---|
| 2004/0077108 A1* | 4/2004 | Ito | H01L 29/7801 438/1 |
| 2006/0001122 A1* | 1/2006 | Ichijo | H01L 29/66659 257/491 |
| 2007/0215949 A1* | 9/2007 | Kijima | H01L 27/0922 257/355 |
| 2009/0309146 A1* | 12/2009 | Ueda | H01L 29/66568 257/296 |
| 2013/0087828 A1 | 4/2013 | Koshimizu et al. | |

FOREIGN PATENT DOCUMENTS

| | | |
|---|---|---|
| JP | 2008-244345 A | 10/2008 |
| JP | 5487304 B2 | 5/2014 |

* cited by examiner

SEMICONDUCTOR DEVICE HAVING AN INSULATOR BETWEEN SOURCE AND DRAIN REGIONS AND A GATE ELECTRODE HAVING A PORTION THAT COVERS THE INSULATOR AND A PORTION THAT DOES NOT COVER THE INSULATOR

CROSS-REFERENCE TO RELATED APPLICATION(S)

This application is based upon and claims the benefit of priority from Japanese Patent Application No. 2019-040448, filed Mar. 6, 2019, the entire contents of which are incorporated herein by reference.

FIELD

Embodiments described herein relate generally to semiconductor devices and methods for producing the semiconductor devices.

BACKGROUND

A double-diffused MOSFET (DMOS) can have improved breakdown voltage resistance by incorporation of a local oxidation of silicon (LOCOS) film between the drain and the channel. However, if the LOCOS films of multiple DMOSs vary in shape, the DMOSs can have varying drift lengths, which undesirably causes variations in breakdown voltage and variations in on-resistance.

DETAILED DESCRIPTION

Embodiments provide a semiconductor device that has fewer variations in breakdown voltage and on resistance and a method for producing the semiconductor device.

In general, according to one embodiment, a semiconductor device includes a semiconductor substrate having a source region and a drain region, a first insulator between the source region and the drain region, a gate electrode having a first end on a side thereof closer to the source region than the drain region on a portion of the semiconductor substrate that is not covered with the first insulator, and having a second end on the first insulator closer to the drain region than the source region, and a second insulator that is continuous with the second end of the gate electrode and having a portion which is on the first insulator where the first insulator is not covered with the gate electrode, is on an end of the drain region, and is in contact with the gate electrode, the first insulator, and the drain region.

According to another embodiment, a method for producing a semiconductor device includes forming a locally oxidized region in the upper surface of a semiconductor substrate by resist patterning and etching, wherein the locally oxidized region has a first end and second end connected with a central portion that is thicker than the first and second ends, with the ends shaped progressively thinner away from the central portion, forming a gate electrode with a first end on the central portion and on one of the thinner ends of the locally oxidized region, and with a second end on the semiconductor outside the locally oxidized region, forming an insulating film on the gate electrode, the locally oxidized region and on the semiconductor outside the locally oxidized region, forming a mask on the first end of the gate electrode, and on the second end of the locally oxidized region, selectively etching the insulating film using the mask, leaving a portion of the insulating film as a spacer insulating film, and forming a source region and a drain region in the semiconductor by implanting impurities using the locally oxidized region, the gate electrode, and the spacer insulating film as a mask.

EMBODIMENT

Hereinafter, an embodiment of the present disclosure will be described.

Figure 1:
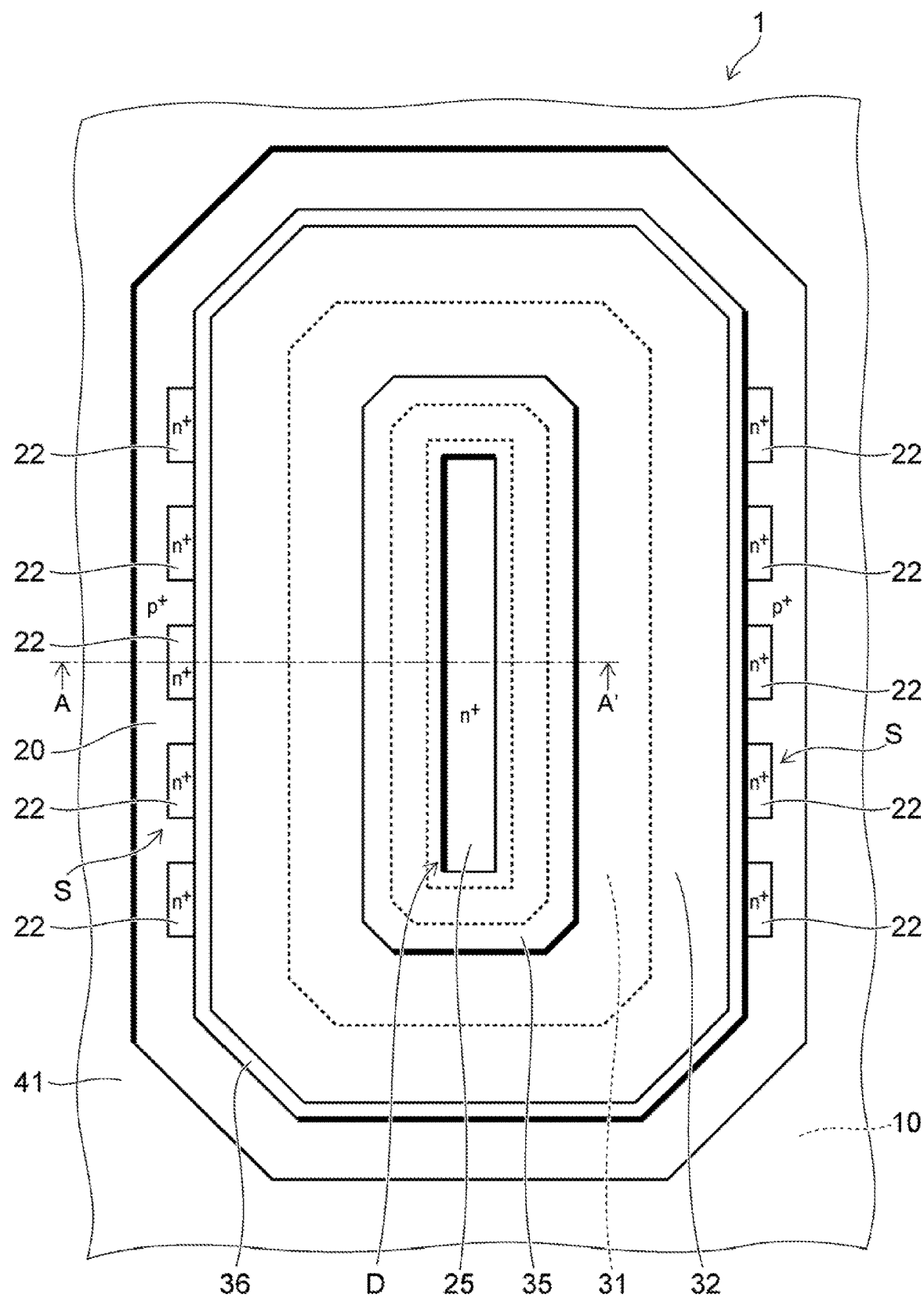
FIG. 1 is a plan view depicting a semiconductor device according to an embodiment.

FIG. 1 is a plan view depicting a semiconductor device according to the present embodiment.

Figure 2:
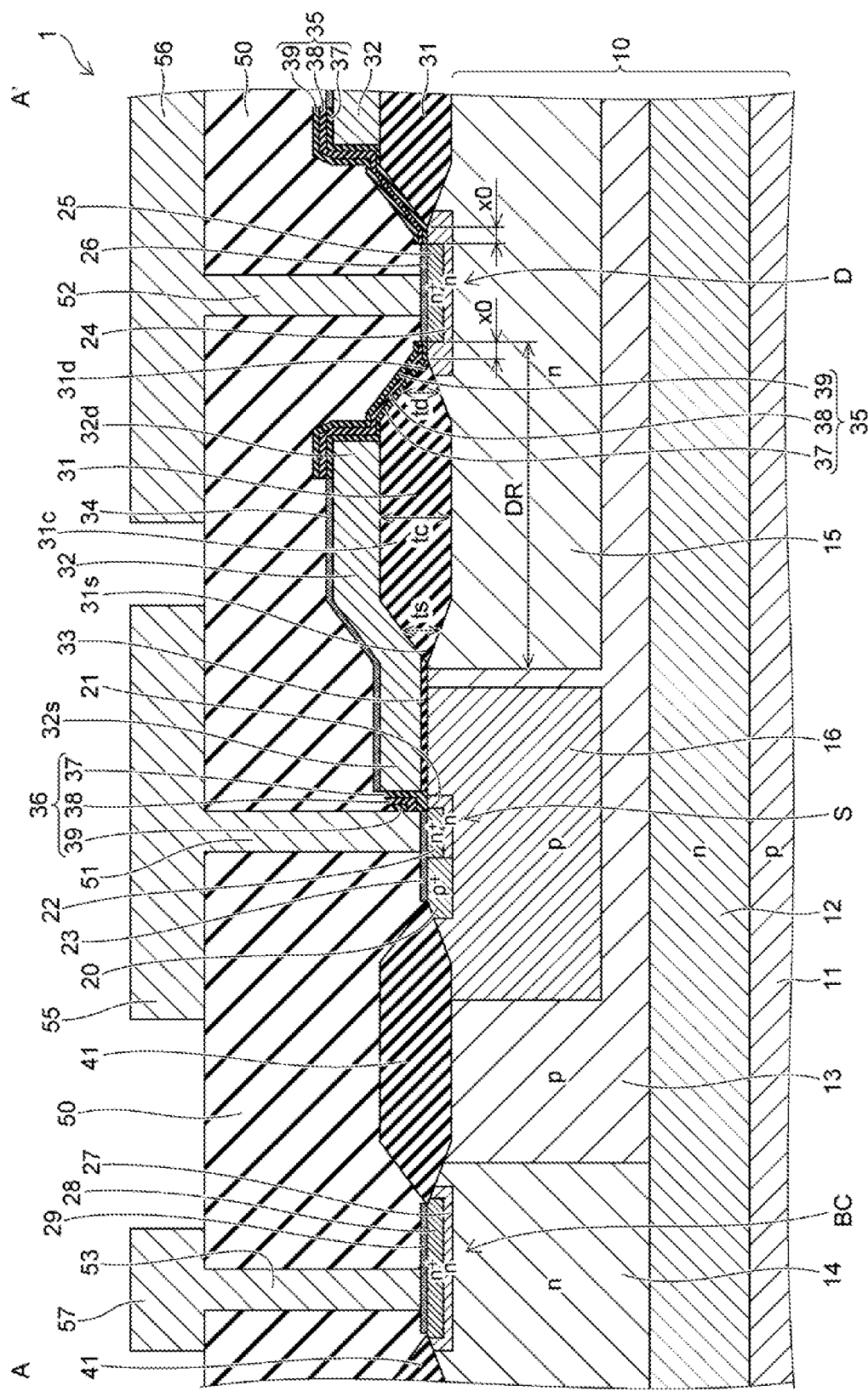
FIG. 2 is a sectional view taken along the line A-A' depicted in FIG. 1.

FIG. 2 is a sectional view taken along the line A-A' depicted in FIG. 1.

The semiconductor device according to the present embodiment is a large-scale integrated (LSI) circuit configured with DMOSs, for example.

Each drawing is a schematic drawing and some elements are exaggerated or omitted as appropriate. Moreover, the size ratio or the like between the elements in one drawing is not always identical to that in another drawing. The same goes for other drawings described later.

FIGS. 1 and 2 depict a semiconductor substrate 10 in a semiconductor device 1. Hereinafter, a direction parallel to the upper surface of the semiconductor substrate 10 is also referred to as a "horizontal direction." The semiconductor substrate 10 contains silicon and impurities and, for example, most of the semiconductor substrate 10 is made of a silicon monocrystal. A p-type substrate 11 whose conductivity type is a p-type, and, on the p-type substrate 11, an n-type embedded layer 12 whose conductivity type is an n-type, are shown in semiconductor substrate 10. The n-type embedded layer 12 is in contact with the p-type substrate 11. A p-type epitaxial layer 13 whose conductivity type is a p-type and a deep n-type well 14 whose conductivity type is an n-type are on the n-type embedded layer 12. The p-type epitaxial layer 13 and the deep n-type well 14 are in contact with the n-type embedded layer 12.

An n-type drift layer 15 (a second semiconductor layer) and a p-type well 16 are within part of the p-type epitaxial layer 13. The n-type drift layer 15 and the p-type well 16 are in contact with the p-type epitaxial layer 13. The impurity concentration of the p-type well 16 is higher than the impurity concentration of the p-type epitaxial layer 13. A first semiconductor layer is configured with the p-type epitaxial layer 13 and the p-type well 16. When viewed from above, the p-type well 16 surrounds the n-type drift layer 15 and is separated from the n-type drift layer 15. The p-type epitaxial layer 13 is interposed between the n-type drift layer 15 and the p-type well 16.

A $p^+$-type layer 20 and an n-type lightly doped drain (LDD) layer 21 are in part of the p-type well 16. An $n^+$-type source layer 22 is on the n-type LDD layer 21. A "$p^+$-type" indicates that the conductivity type is a p-type and the impurity concentration is higher than the impurity concentration of a "p-type." Likewise, an "$n^+$-type" indicates that the conductivity type is an n-type and the impurity concentration is higher than the impurity concentration of an "n-type." The n-type LDD layer 21 and the $n^+$-type source layer 22 are in contact with the $p^+$-type layer 20. Moreover, the $p^+$-type layer 20 and the n-type LDD layer 21 are in contact with the p-type well 16. A silicide layer 23 is on the upper surfaces of the $p^+$-type layer 20 and the $n^+$-type source layer 22. The n-type LDD layer 21, the $n^+$-type source layer 22, and the silicide layer 23 form a source region S.

An n-type LDD layer 24 is within part of the n-type drift layer 15. The n-type LDD layer 24 is in contact with the n-type drift layer 15. An $n^+$-type drain layer 25 is in part of the n-type LDD layer 24. The $n^+$-type drain layer 25 is in contact with the n-type LDD layer 24. A silicide layer 26 is on the upper surface of the $n^+$-type drain layer 25. The n-type LDD layer 24, the $n^+$-type drain layer 25, and the silicide layer 26 form a drain region D.

In part of the deep n-type well 14, an n-type LDD layer 27 is provided. The n-type LDD layer 27 is in contact with the deep n-type well 14. In part of the n-type LDD layer 27, an $n^+$-type contact layer 28 is provided. The $n^+$-type contact layer 28 is in contact with the n-type LDD layer 27. On the upper surface of the $n^+$-type contact layer 28, a silicide layer 29 is provided. The n-type LDD layer 27, the $n^+$-type contact layer 28, and the silicide layer 29 form a body contact region BC.

The semiconductor substrate 10 shown in FIG. 1 and FIG. 2 is formed of the p-type substrate 11, the n-type embedded layer 12, the p-type epitaxial layer 13, the deep n-type well 14, the n-type drift layer 15, the p-type well 16, the $p^+$-type layer 20, the n-type LDD layer 21, the $n^+$-type source layer 22, the silicide layer 23, the n-type LDD layer 24, the $n^+$-type drain layer 25, the silicide layer 26, the n-type LDD layer 27, the $n^+$-type contact layer 28, and the silicide layer 29.

A LOCOS film 31, herein termed "a first insulating section" is provided on the semiconductor substrate 10. The LOCOS film 31 is made of silicon oxide and therefore contains silicon and oxygen. Half of the LOCOS film 31 is embedded in the semiconductor substrate 10 with respect to a plane surface thereof; a lower part of the LOCOS film 31 is provided in the semiconductor substrate 10 and an upper part is provided on the semiconductor substrate 10. The ends of the LOCOS film 31 each have the shape of a bird's beak; the closer to the tip, the smaller the thickness.

When viewed from above, the LOCOS film 31 is disposed between the source region S and the drain region D and surrounds the drain region D in a circular manner. An end 31d of the LOCOS film 31 on the side thereof close to the drain region D is disposed on the n-type LDD layer 24 and the other portion of the LOCOS film 31 is disposed on the n-type drift layer 15. The end 31d of the LOCOS film 31 on the side thereof close to the drain region D includes at least a portion including an end edge (an inner edge) thereof closest to the drain region D. Likewise, a portion of the LOCOS film 31 including an end edge (an outer edge) thereof closest to the source region S is referred to as an end 31s of the LOCOS film 31 on the side thereof close to the source region S. It is to be noted that, in the horizontal direction, the length of the end 31d is less than half the entire length of the LOCOS film 31. Likewise, the length of the end 31s is less than half the entire length of the LOCOS film 31. A portion of the LOCOS film 31, which is located between the end 31d and the end 31s, is a central part 31c. The thickness td of the end 31d of the LOCOS film 31 and the thickness ts of the end 31s of the LOCOS film 31 are smaller than the thickness tc of the central part 31c. That is, td<tc and ts<tc.

A gate electrode 32 is provided on the semiconductor substrate 10 and the LOCOS film 31. The gate electrode 32 is made of a conductive material such as for example, polysilicon. When viewed from above, the gate electrode 32 has a circular shape surrounding the drain region D. The inner periphery of the gate electrode 32, that is, a portion of the gate electrode 32 on the side thereof close to the drain region D, is located on the outer periphery of the LOCOS film 31. Specifically, an end 32s of the gate electrode 32 on the side thereof close to the source region S is disposed on a portion, which is not covered with the LOCOS film 31, of the semiconductor substrate 10, specifically, on the p-type well 16. An end 32d of the gate electrode 32 on the side thereof close to the drain region D is disposed on the LOCOS film 31. Between the semiconductor substrate 10 and the gate electrode 32, a gate insulating film 33 made of silicon oxide is provided. The end 32s of the gate electrode 32 on the side thereof close to the source region S comprises at least a portion of the gate electrode 32 including an end edge (an outer edge) thereof closest to the source region S. Likewise, the end 32d of the gate electrode 32 on the side thereof close to the drain region D comprises at least a portion of the gate electrode 32 including an end edge (an inner edge) thereof closest to the drain region D.

From an area on the inner periphery of the gate electrode 32 to an area on the n-type LDD layer 24, a spacer insulating film 35 (a second insulating section) on the drain side is provided. More specifically, the spacer insulating film 35 is continuously provided on the end 32d of the gate electrode 32 on the side thereof close to the drain region D and covers a portion of the gate electrode 32, the LOCOS film 31, and an end of the drain region D on the side thereof close to the LOCOS film 31. That is, when viewed from above, the spacer insulating film 35 extends from an edge of the LOCOS film 31 on the side thereof close to the drain region D to an area on the n-type LDD layer 24 and overlaps with the n-type LDD layer 24. The amount of overlap between the LOCOS film 31 and the n-type LDD layer 24 when viewed from above is x0 µm in this embodiment. The amount of overlap x0 is larger than zero.

The spacer insulating film 35 is in contact with the gate electrode 32, the LOCOS film 31, and the n-type LDD layer 24. A silicide layer 34 is provided in a region of the upper surface of the gate electrode 32, which is not covered with the spacer insulating film 35.

A spacer insulating film 36 (a third insulating film) on the source side is provided on an end face of the end 32s of the gate electrode 32 on the side thereof close to the source region S. The spacer insulating film 36 is in contact with an end face of the gate electrode 32 on the outer periphery thereof and the upper surface of the n-type LDD layer 21.

The spacer insulating films 35 and 36 are each an ONO film, for instance. That is, a silicon oxide layer 37 made of silicon oxide, a silicon nitride layer 38 made of silicon nitride, and a silicon oxide layer 39 made of silicon oxide are stacked in order from the lower layer side.

The silicon oxide layer 37 (a first layer) of the spacer insulating film 35 on the drain side is in contact with the gate electrode 32, the LOCOS film 31, and the n-type LDD layer 24. The silicon nitride layer 38 (a second layer) of the spacer insulating film 35 is provided on the silicon oxide layer 37 and in contact with the silicon oxide layer 37. The silicon oxide layer 39 (a third layer) of the spacer insulating film 35 is provided on the silicon nitride layer 38 and in contact with the silicon nitride layer 38.

The silicon oxide layer 37 (a fourth layer) of the spacer insulating film 36 on the source side is in contact with the end face of the gate electrode 32 on the outer periphery thereof and the upper surface of the n-type LDD layer 21. Thus, the silicon oxide layer 37 of the spacer insulating film 36 is approximately L-shaped in cross section. The silicon nitride layer 38 (a fifth layer) of the spacer insulating film 36 is provided on the silicon oxide layer 37 and in contact with the silicon oxide layer 37. The silicon nitride layer 38 of the spacer insulating film 36 is also approximately L-shaped in cross section. The silicon oxide layer 39 (a sixth layer) of the spacer insulating film 36 is provided on the silicon nitride layer 38 and in contact with the silicon nitride layer 38.

Each of the spacer insulating films 35 and 36 is not limited to an ONO film and may be a single-layer silicon oxide film, a single-layer silicon nitride film, or a multilayer film including a silicon oxide layer and a silicon nitride layer stacked in any manner, or may include a layer made of other insulating materials.

On part of the semiconductor substrate 10, a LOCOS film 41 is provided. When viewed from above, the LOCOS film 41 has a circular shape surrounding the gate electrode 32. The LOCOS film 41 is separated from the LOCOS film 31 and the gate electrode 32. The ends of the LOCOS film 41 each have the shape of a bird's beak; the closer to the tip, the smaller the thickness. A lower part of the LOCOS film 41 is disposed in the semiconductor substrate 10 and an upper part is disposed on the semiconductor substrate 10 with respect to a surface plane of the semiconductor substrate 10. The lower surface of the LOCOS film 41 is in contact with the $p^+$-type layer 20, the p-type well 16, the p-type epitaxial layer 13, the deep n-type well 14, and the n-type LDD layer 27.

An interlayer insulating film 50 is provided above the semiconductor substrate 10, the LOCOS film 31, the gate electrode 32, the spacer insulating film 35, the spacer insulating film 36, and the LOCOS film 41. The interlayer insulating film 50 is made of silicon oxide, for example. Since the gate electrode 32 and the spacer insulating film 35 are interposed between the LOCOS film 31 and the interlayer insulating film 50, the LOCOS film 31 is separated from the interlayer insulating film 50.

In the interlayer insulating film 50, a source contact 51, a drain contact 52, and a body contact 53 are provided. The lower end of the source contact 51 is connected to the silicide layer 23. The lower end of the drain contact 52 is connected to the silicide layer 26. The lower end of the body contact 53 is connected to the silicide layer 29.

On the interlayer insulating film 50, a source electrode 55, a drain electrode 56, and a body electrode 57 are provided. The source electrode 55 is connected to the upper end of the source contact 51. The drain electrode 56 is connected to the upper end of the drain contact 52. The body electrode 57 is connected to the upper end of the body contact 53.

With this configuration, a DMOS is formed in the semiconductor device 1. The distance between the p-type epitaxial layer 13 and the $n^+$-type drain layer 25 in the n-type drift layer 15 in the horizontal direction is the drift length DR of the DMOS.

Next, a method for producing the semiconductor device according to the present embodiment will be described.

FIGS. 3 to 14 are sectional views showing the method for producing the semiconductor device according to the present embodiment.

FIGS. 3 to 14 each depict the cross-section corresponding to the cross-section depicted in FIG. 2.

Figure 3:
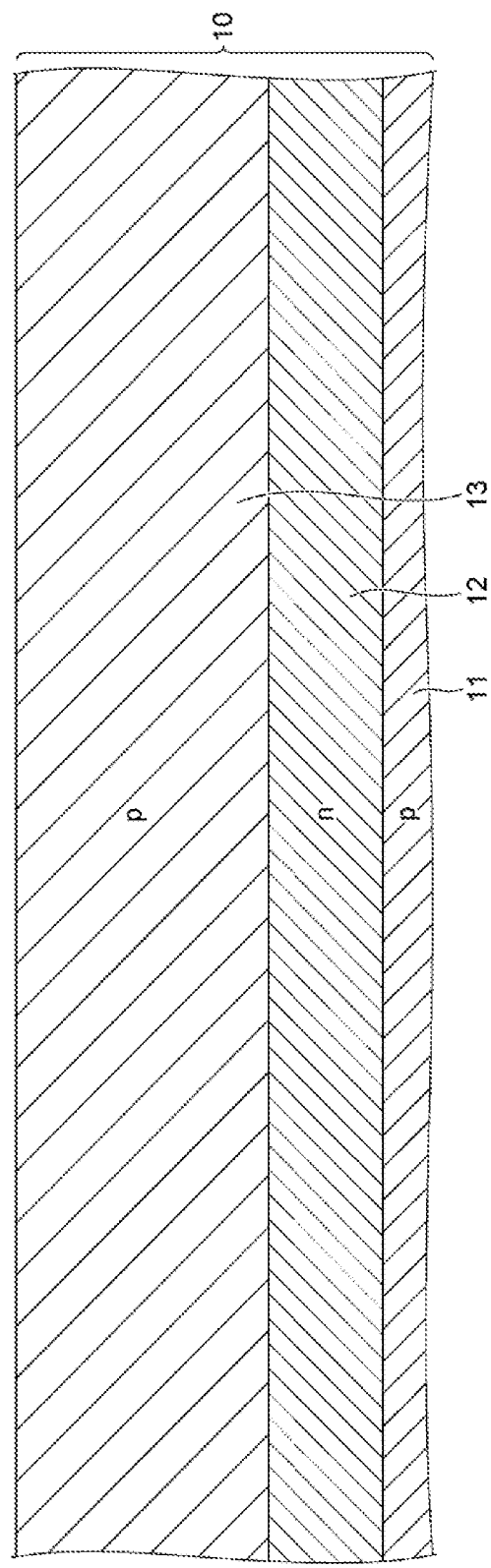
FIG. 3 is a sectional view showing structural details of a method for producing the semiconductor device according to an embodiment.

First, as depicted in FIG. 3, the p-type substrate 11 is prepared. Next, by implanting impurities, which become donors, into an upper-layer portion of the p-type substrate 11, the n-type embedded layer 12 is formed. Then, the p-type epitaxial layer 13 is formed by growing silicon on the n-type embedded layer 12 by epitaxial growth. Hereinafter, the p-type substrate 11, the n-type embedded layer 12, and the p-type epitaxial layer 13 will be collectively referred to as the "semiconductor substrate 10." In the following processes, various other layers and regions are additionally formed on and in the semiconductor substrate 10.

Figure 4:
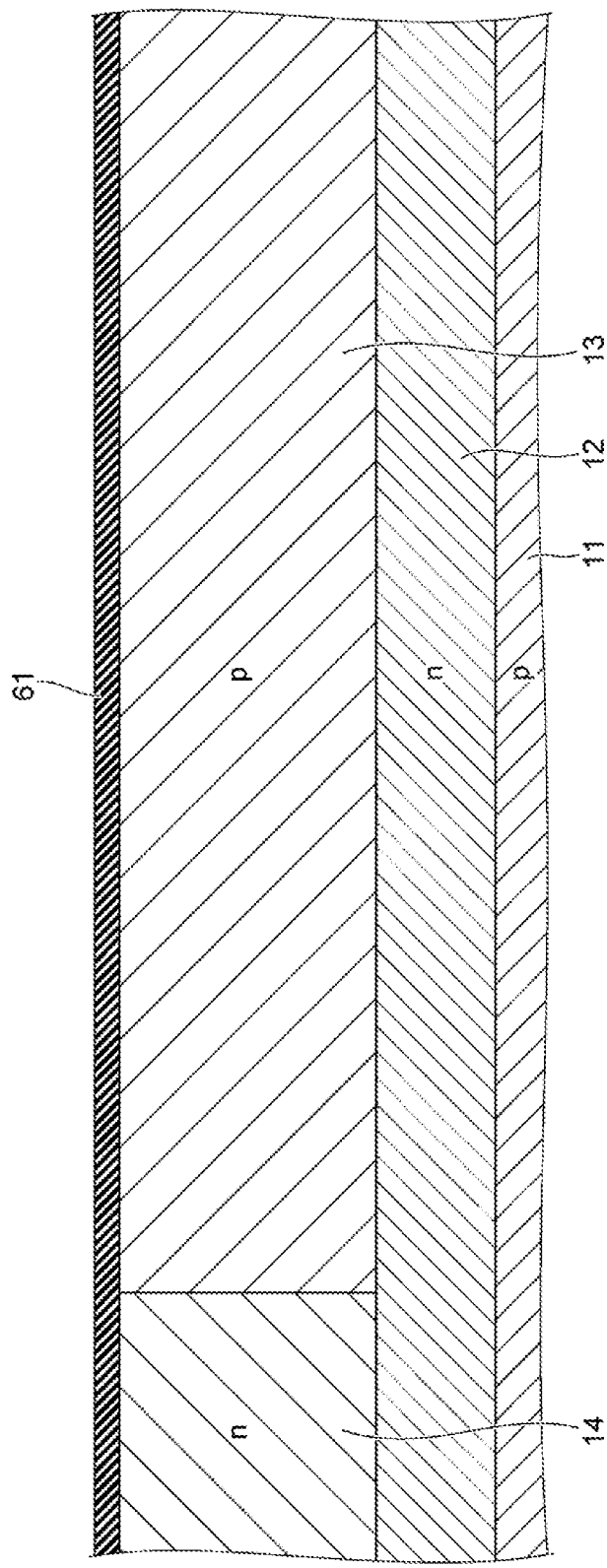
FIG. 4 is a sectional view showing structural details of a method for producing the semiconductor device according to an embodiment.

Next, as depicted in FIG. 4, a silicon oxide layer 61 is formed on the surface of the p-type epitaxial layer 13. Then, by forming a resist pattern (which is not depicted in the drawing) on the silicon oxide layer 61, ion-implanting impurities which become donors, and diffusing the implanted impurities, the deep n-type well 14 is formed. Next, the resist pattern is removed.

Figure 5:
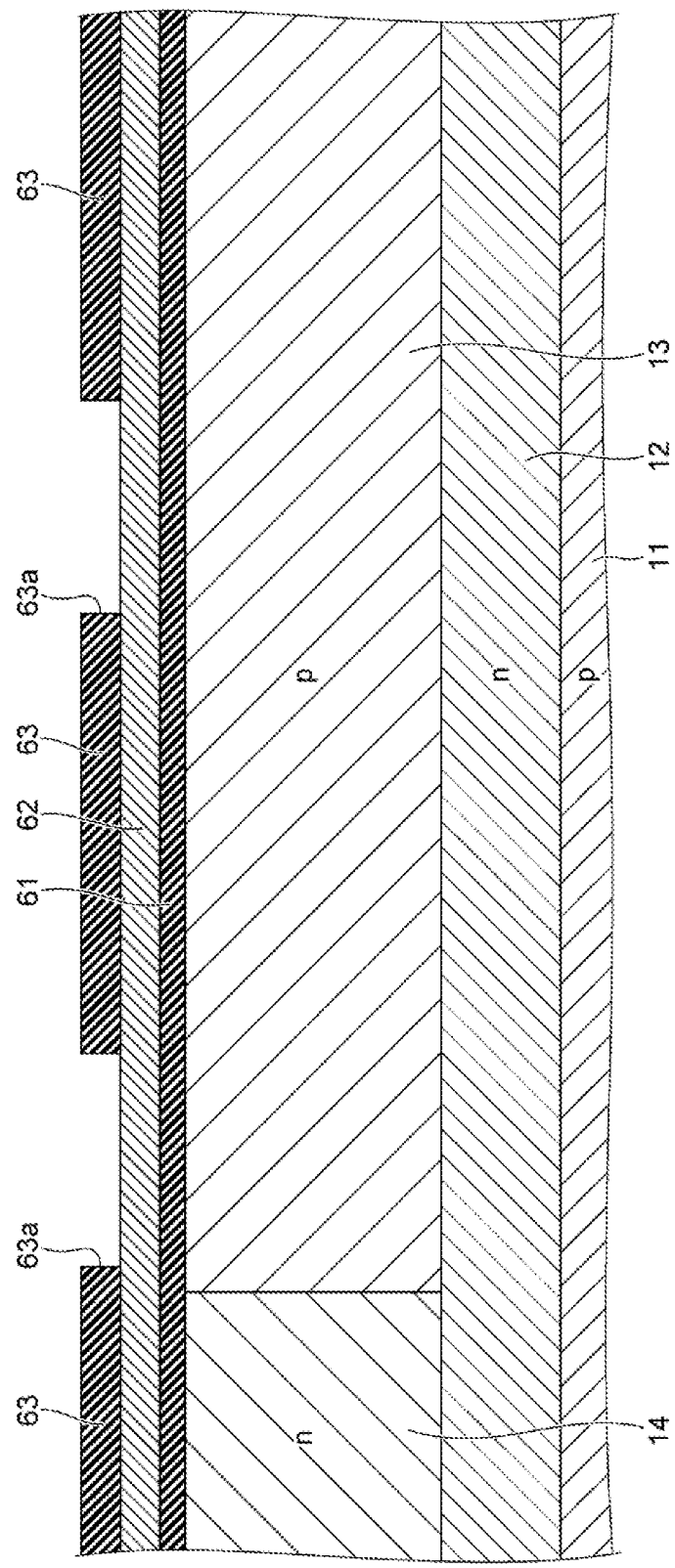
FIG. 5 is a sectional view showing structural details of ae method for producing the semiconductor device according to an embodiment.

Then, as depicted in FIG. 5, a polysilicon layer 62 is formed on the silicon oxide layer 61. Next, a silicon nitride layer 63 (a first insulating layer) is formed on the polysilicon layer 62. Then, by forming a resist pattern (which is not depicted in the drawing) on the silicon nitride layer 63 and selectively removing the silicon nitride layer 63 by performing etching such as reactive ion etching (RIE), openings 63a are formed in regions in which the LOCOS film 31 and the LOCOS film 41 will be formed. Next, the resist pattern is removed.

Figure 6:
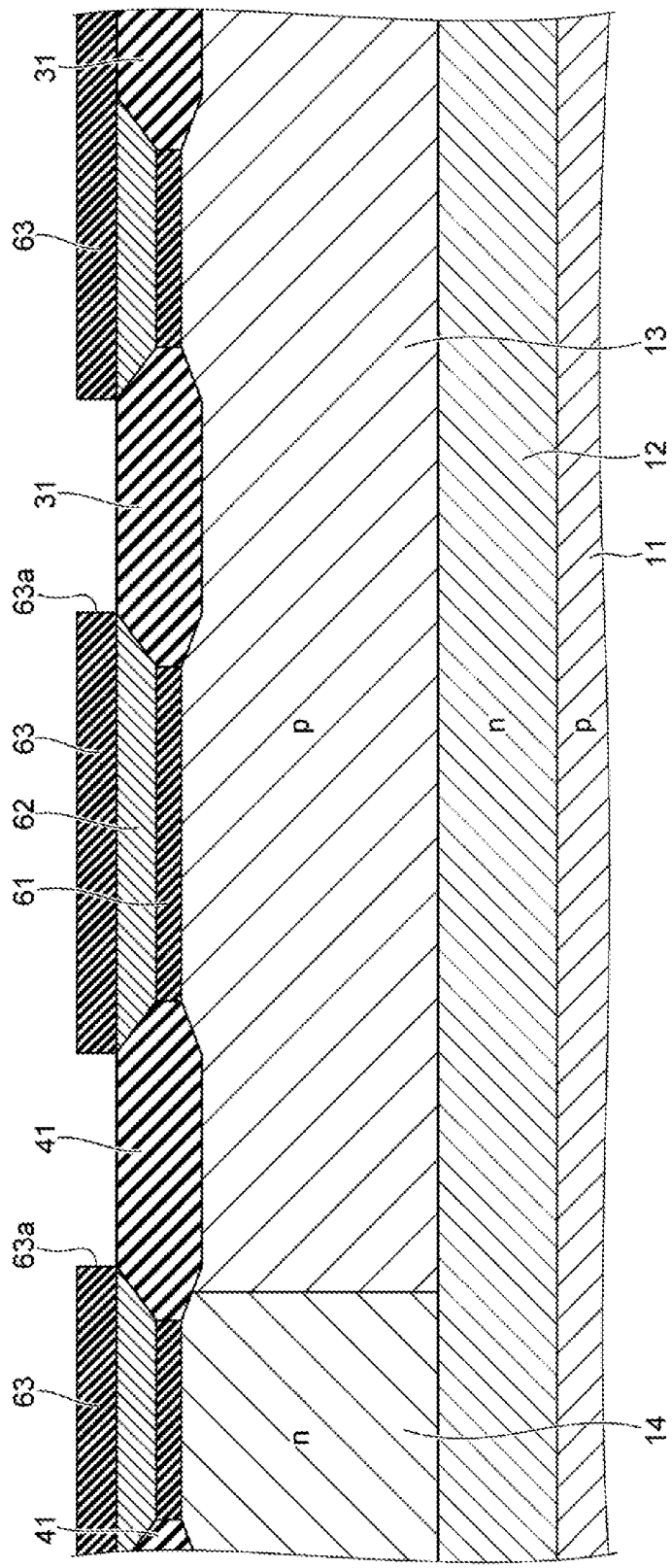
FIG. 6 is a sectional view showing structural details of a method for producing the semiconductor device according to an embodiment.

Then, as depicted in FIG. 6, thermal oxidation treatment is performed. Consequently, oxidization of the polysilicon layer 62 and the p-type epitaxial layer 13 starts from the openings 63a of the silicon nitride layer 63. As a result, the LOCOS film 31 and the LOCOS film 41 are formed on the upper surface of the semiconductor substrate 10. The ends of the LOCOS film 31 and the LOCOS film 41 each have the shape of a bird's beak; the closer to the tip, the smaller the thickness.

Figure 7:
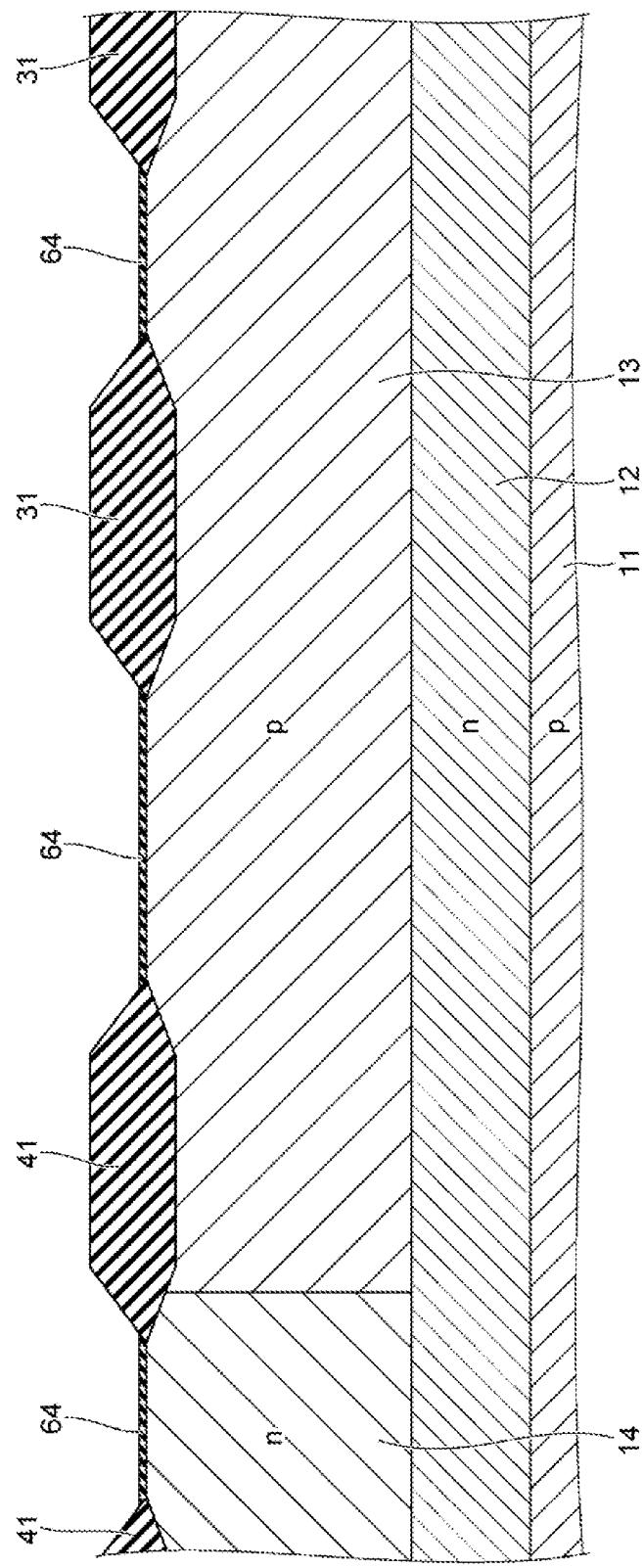
FIG. 7 is a sectional view showing structural details of a method for producing the semiconductor device according to an embodiment.

Next, as depicted in FIG. 7, by performing wet etching, for example, the silicon nitride layer 63 is removed. Then, by performing chemical dry etching (CDE), for instance, the polysilicon layer 62 is removed. Next, by performing etching using ammonium fluoride ($NH_4F$), for example, the silicon oxide layer 61 is removed. At the same time, the upper-layer portions of the LOCOS films 31 and 41 are also removed. Then, a dummy oxide layer 64 made of silicon oxide is formed on the exposed surfaces of the p-type epitaxial layer 13 and the deep n-type well 14.

Figure 8:
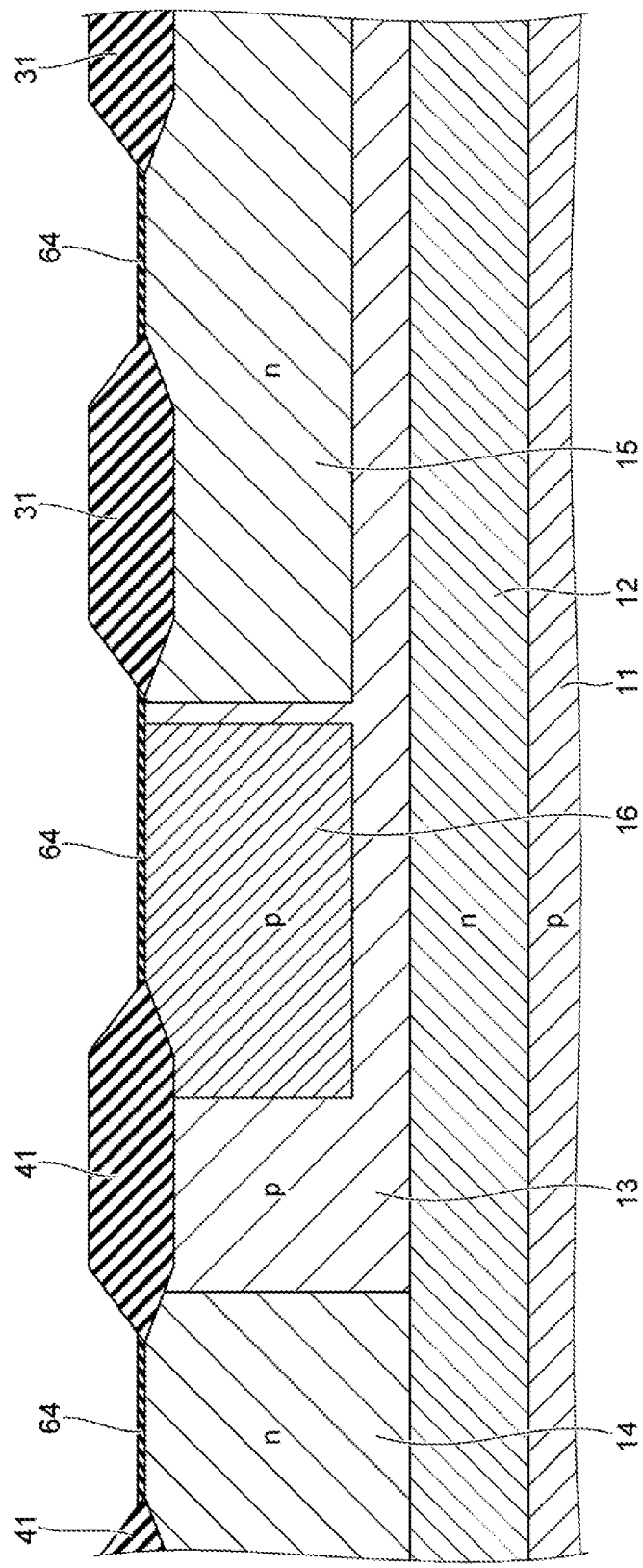
FIG. 8 is a sectional view showing structural details of a method for producing the semiconductor device according to an embodiment.

Next, as depicted in FIG. 8, by forming a resist pattern (which is not depicted in the drawing) and ion-implanting impurities, which become donors, the n-type drift layer 15 is formed in the p-type epitaxial layer 13. Some of the impurities pass through the LOCOS film 31 and are implanted into the p-type epitaxial layer 13. Then, the resist pattern is removed. Moreover, by forming a resist pattern (which is not depicted in the drawing) and ion-implanting impurities which become acceptors, the p-type well 16 is formed in the p-type epitaxial layer 13. Some of the impurities are implanted into the p-type epitaxial layer 13 via the LOCOS film 41. Then, the resist pattern is removed. The n-type drift layer 15 and the p-type well 16 may be formed in any order. The n-type drift layer 15 and the p-type well 16 are separated from each other by a predetermined distance.

Figure 9:
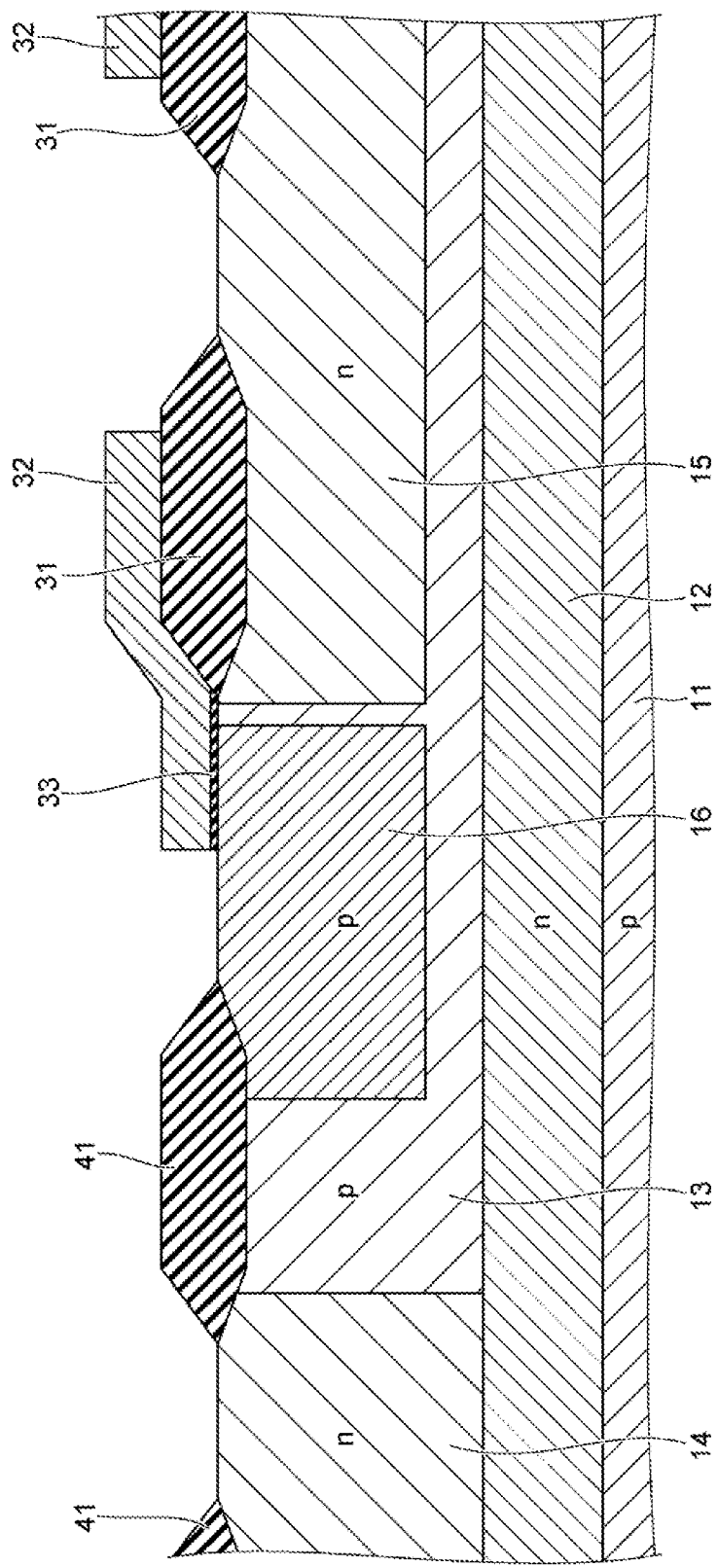
FIG. 9 is a sectional view showing structural details of a method for producing the semiconductor device according to an embodiment.

Next, as depicted in FIG. 9, by performing etching using ammonium fluoride, for example, the dummy oxide layer 64 is removed. Then, by performing thermal oxidation, for instance, the gate insulating film 33 is formed on the upper surface of the semiconductor substrate 10. Next, by depositing polysilicon, a polysilicon film is formed on the entire surface. Then, the polysilicon film is selectively removed by forming a resist pattern (not shown) in a region in which the gate electrode 32 will be formed and by etching such as RIE using this resist pattern as a mask. As a result, the gate electrode 32 is formed. At the same time, a portion of the gate insulating film 33, which is not covered with the gate electrode 32, is also removed.

Figure 10:
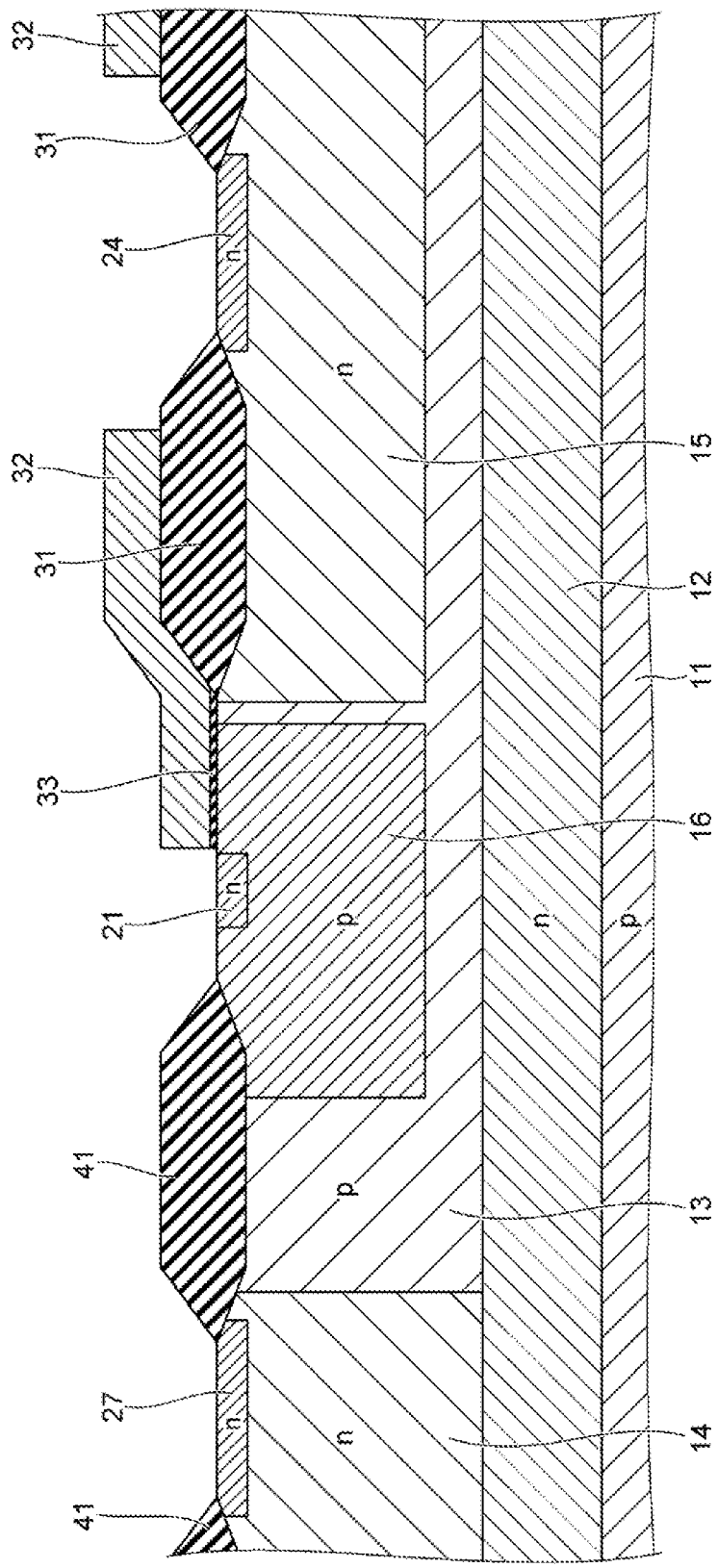
FIG. 10 is a sectional view showing structural details of a method for producing the semiconductor device according to an embodiment.

Next, as depicted in FIG. 10, a resist pattern (which is not depicted in the drawing) is formed and impurities, which become donors, are ion-implanted using the resist pattern, the LOCOS films 31 and 41, and the gate electrode 32 as a mask. As a result, the n-type LDD layers 21, 24, and 27 are formed. Then, the resist pattern is removed.

Figure 11:
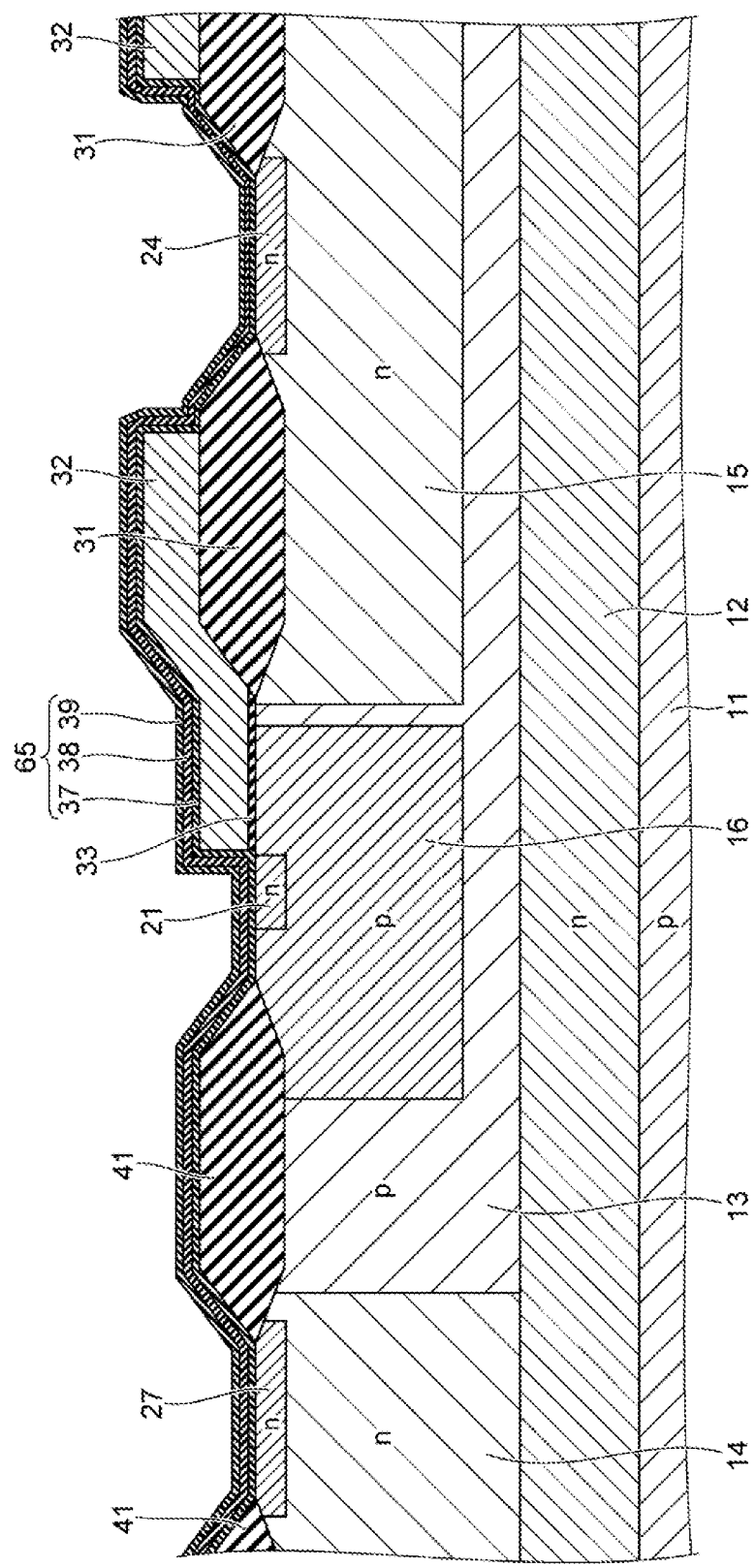
FIG. 11 is a sectional view showing structural details of a method for producing the semiconductor device according to an embodiment.

Next, as depicted in FIG. 11, by depositing, for example, the silicon oxide layer 37, the silicon nitride layer 38, and the silicon oxide layer 39 in this order, a spacer insulating film 65 is formed on the entire surface. The spacer insulating film 65 may be a single-layer silicon oxide film, a single-layer silicon nitride film, or a multilayer film including a silicon oxide layer and a silicon nitride layer stacked in any manner, or may include a layer made of other insulating materials.

Figure 12:
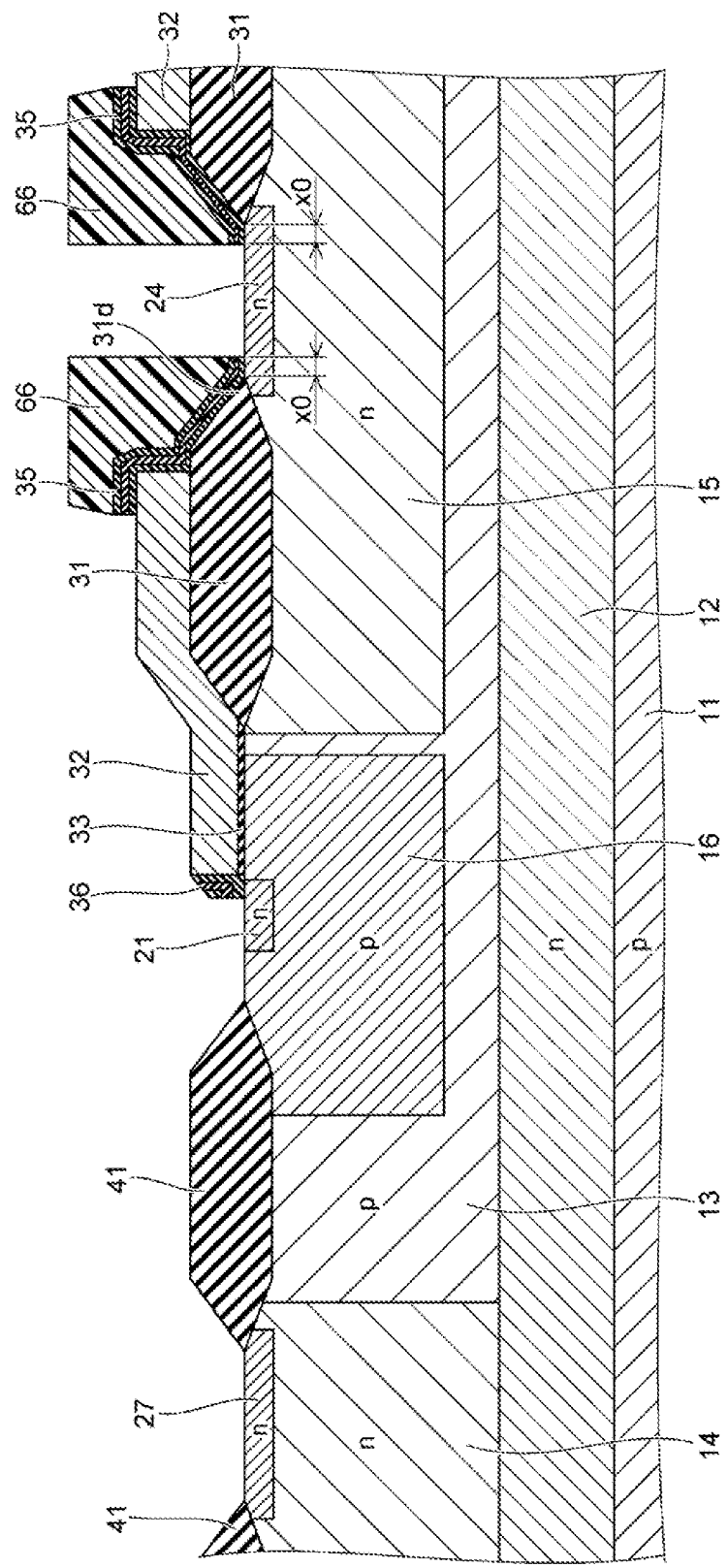
FIG. 12 is a sectional view showing structural details of a method for producing the semiconductor device according to an embodiment.

Then, as depicted in FIG. 12, a resist pattern 66 is formed by photolithography in such a way as to cover a portion of the gate electrode 32 on the side thereof close to the n-type LDD layer 24, a portion, which is not covered with the gate electrode 32, of the LOCOS film 31, and a portion of the n-type LDD layer 24 on the side thereof close to the LOCOS film 31. That is, the resist pattern 66 is formed in the shape of a circle surrounding the n-type LDD layer 24 when viewed from above and made to extend to an area on the n-type LDD layer 24 from an area on the LOCOS film 31.

The amount of overlap x0 between the resist pattern 66 and the n-type LDD layer 24 is a predetermined value larger than zero.

Next, etching such as RIE is performed on the spacer insulating film 65 using the resist pattern 66 as a mask. As a result, the spacer insulating film 65 is selectively removed. A portion of the spacer insulating film 65, which is covered with the resist pattern 66, is not removed and becomes the spacer insulating film 35. On the other hand, a portion of the spacer insulating film 65, which is disposed on the end face of the gate electrode 32 on the side thereof close to the n-type LDD layer 21, also remains and becomes the spacer insulating film 36. As described above, since the spacer insulating films 35 and 36 are formed of the same spacer insulating film 65, the spacer insulating films 35 and 36 have the same film configuration. Then, the resist pattern 66 is removed.

Figure 13:
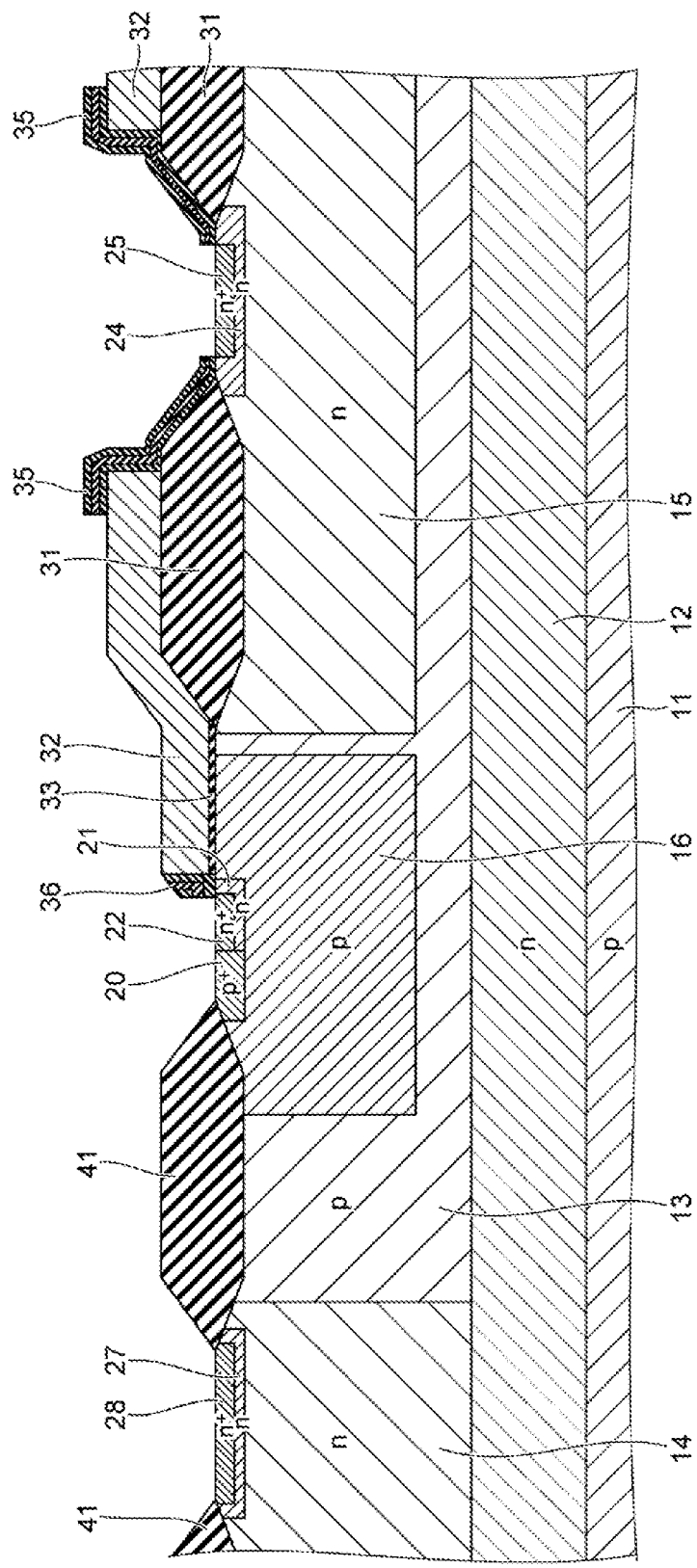
FIG. 13 is a sectional view showing structural details of a method for producing the semiconductor device according to an embodiment.

Next, as depicted in FIG. 13, the $p^+$-type layer 20 is formed by forming a resist pattern (which is not depicted in the drawing) and ion-implanting impurities, which become acceptors, using the resist pattern and the LOCOS film 41 as a mask. Then, the resist pattern is removed. Moreover, by forming a resist pattern (which is not depicted in the drawing) and ion-implanting impurities, which become donors, using the resist pattern, the LOCOS film 31, the gate electrode 32, the spacer insulating film 35, and the spacer insulating film 36 as a mask, the $n^+$-type source layer 22, the $n^+$-type drain layer 25, and the $n^+$-type contact layer 28 are also formed. In this case, the $n^+$-type source layer 22 is formed using the spacer insulating film 36 as a mask, the $n^+$-type drain layer 25 is formed using the spacer insulating film 35 as a mask, and the $n^+$-type contact layer 28 is formed using the LOCOS film 41 as a mask. The formation of the $n^+$-type source layer 22, the $n^+$-type drain layer 25, and the $n^+$-type contact layer 28, and the formation of the $p^+$-type layer 20 may be performed in any order.

Figure 14:
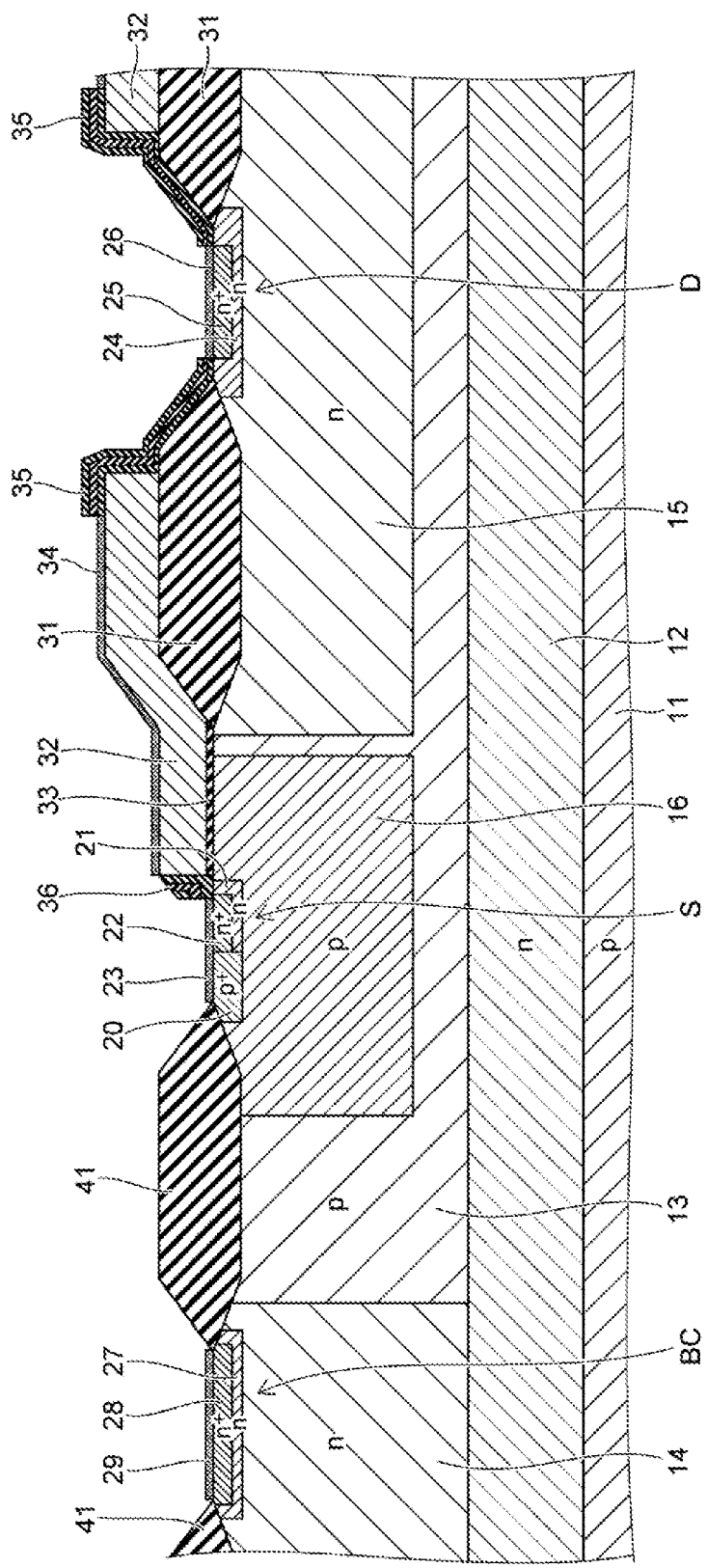
FIG. 14 is a sectional view showing structural details of a method for producing the semiconductor device according to an embodiment.

Then, as depicted in FIG. 14, silicidation treatment is performed. As a result, silicide is formed on the exposed surface of the semiconductor substrate 10 and the exposed surface of the gate electrode 32. Specifically, the silicide layer 23 is formed on the upper surfaces of the $p^+$-type layer 20 and the $n^+$-type source layer 22, the silicide layer 26 is formed on the upper surface of the $n^+$-type drain layer 25, the silicide layer 29 is formed on the upper surface of the $n^+$-type contact layer 28, and the silicide layer 34 is formed on the exposed surface of the gate electrode 32. The n-type LDD layer 21, the $n^+$-type source layer 22, and the silicide layer 23 form the source region S. The n-type LDD layer 24, the $n^+$-type drain layer 25, and the silicide layer 26 form the drain region D, and the n-type LDD layer 27, the $n^+$-type contact layer 28, and the silicide layer 29 form the body contact region BC.

Next, as depicted in FIG. 2, the interlayer insulating film 50 is formed on the semiconductor substrate 10. Then, the source contact 51 is formed in the interlayer insulating film 50 and connected to the silicide layer 23, the drain contact 52 is formed in the interlayer insulating film 50 and connected to the silicide layer 26, and the body contact 53 is formed in the interlayer insulating film 50 and connected to the silicide layer 29. Next, the source electrode 55 is formed on the interlayer insulating film 50 and connected to the source contact 51, the drain electrode 56 is formed on the interlayer insulating film 50 and connected to the drain contact 52, and the body electrode 57 is formed on the interlayer insulating film 50 and connected to the body contact 53. In this way, the semiconductor device 1 according to the present embodiment is produced.

Next, the effects of the present embodiment will be described.

In the present embodiment, in the process shown in FIG. 12, the resist pattern 66 is formed in such a way as to cover the end 31d of the LOCOS film 31 on the side thereof close to the drain region D. Then, by selectively removing the spacer insulating film 65 by etching such as RIE using the resist pattern 66 as a mask, the spacer insulating film 35 is formed. As a result, the spacer insulating film 35 is formed immediately below the resist pattern 66. Moreover, since the end 31d of the LOCOS film 31 is protected by the resist pattern 66, the end 31d is not etched. Then, in the process shown in FIG. 13, by implanting impurities using the spacer insulating film 35 as a mask, the n+-type drain layer 25 is formed. As a result, the n+-type drain layer 25 is formed in an upper-layer part of a portion, which is not covered with the spacer insulating film 35, of the n-type LDD layer 24.

As described above, in the present embodiment, since the position of the spacer insulating film 35 is defined by the resist pattern 66 and the position of the n+-type drain layer 25 is defined by the spacer insulating film 35, the position of the n+-type drain layer 25 can be defined by the resist pattern 66. Since the resist pattern 66 is formed by photolithography, the resist pattern 66 is formed with high positional accuracy. Thus, the n+-type drain layer 25 can also be formed with high positional accuracy. As a result, variations in the drift lengths DR of DMOSs can be prevented. Therefore, breakdown voltage and on resistance of DMOSs can be precisely controlled.

COMPARATIVE EXAMPLE

Next, a comparative example will be described.

Figure 15:
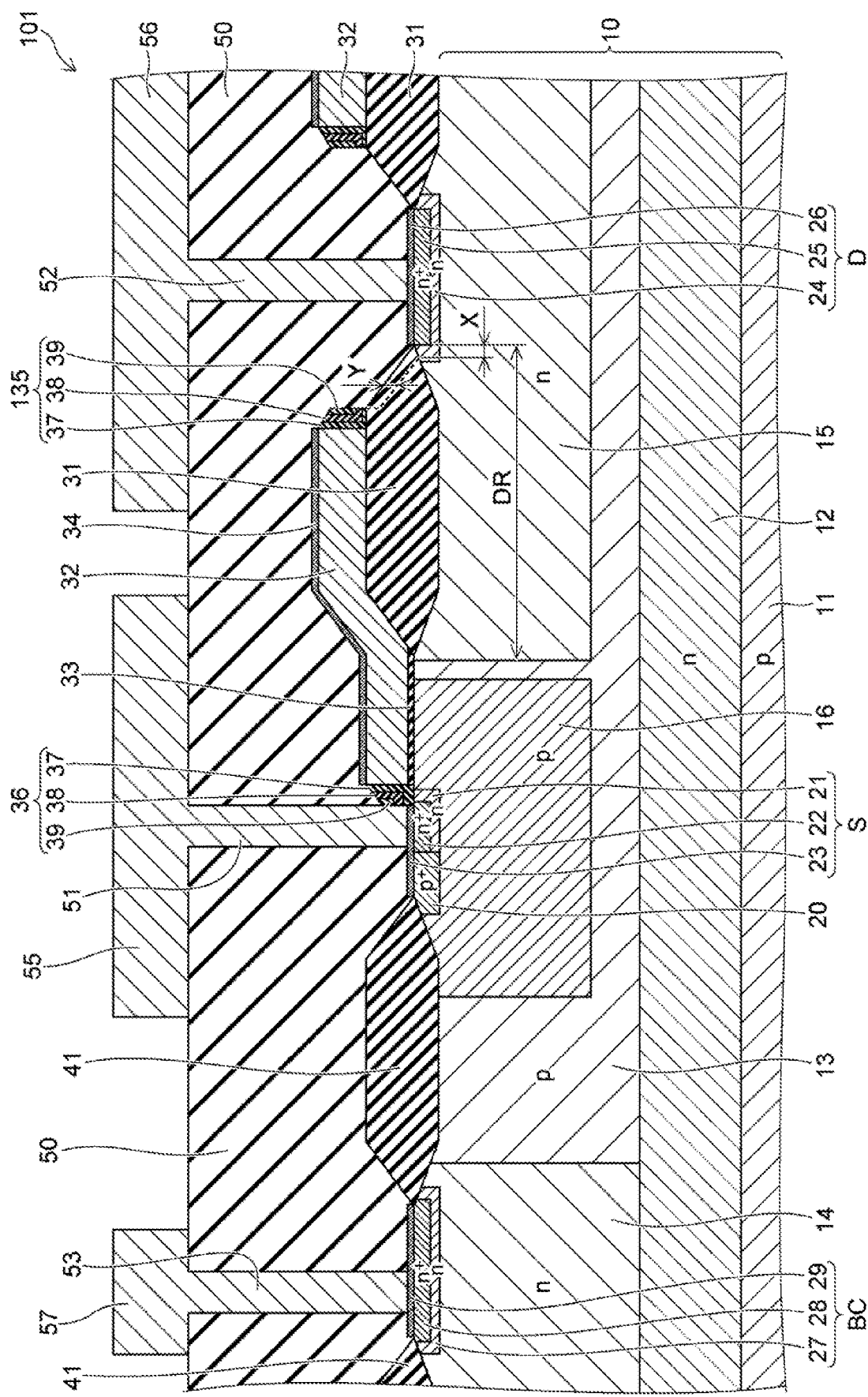
FIG. 15 is a sectional view showing structural details of a method for producing a semiconductor device according to a comparative example.

FIG. 15 is a sectional view depicting a semiconductor device according to this comparative example.

In this comparative example of the process shown in FIG. 12, etching such as RIE is performed on the spacer insulating film 65 without the formation of the resist pattern 66. As a result, the spacer insulating film 65 remains only on the end faces of the gate electrode 32 and becomes spacer insulating films 135 and 36. Then, in the process shown in FIG. 13, the n+-type drain layer 25 is formed using the LOCOS film 31 as a mask. As just described, in this comparative example, the position of the n+-type drain layer 25 is determined by the LOCOS film 31.

However, as depicted in FIG. 15, the shape of the LOCOS film 31 varies depending on etching which is performed on the spacer insulating film 65. Specifically, at the time of etching the spacer insulating film 65, a portion, which is not covered with the gate electrode 32, of the LOCOS film 31 is also inevitably etched. Since the ends of the LOCOS film 31 each have the shape of a bird's beak; the closer to the tip, the smaller the thickness, when the LOCOS film 31 is etched from above, as the end 31d retreats toward the source region S. That is, the amount of vertical displacement Y of the upper surface of the LOCOS film 31 caused by the etching is converted into the amount of horizontal displacement X of the edge of the LOCOS film 31 on the side thereof close to the drain region D. The sharper the shape of the tip of the LOCOS film 31, the higher the ratio at which the amount of vertical displacement Y is converted into the amount of horizontal displacement X. For this reason, if the amount of vertical displacement Y varies by various factors, then the amount of horizontal displacement X varies greatly, which results in large variations in the drift lengths DR of DMOSs. Thus, a semiconductor device 101 according to this comparative example shows large variations in breakdown voltage and on resistance of DMOSs.

On the other hand, according to the above-described embodiment, since the position of the n+-type drain layer 25 is defined by the resist pattern 66, variations in the drift lengths DR are small. As a result, variations in breakdown voltage and on resistance of DMOSs can be prevented. In one example, the present embodiment could reduce variations in breakdown voltage and on resistance to ⅔ of the variations observed in the comparative example.

The embodiment described above can provide a semiconductor device that can prevent variations in breakdown voltage and on resistance and a method for producing the semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a source region and a drain region;
   a first insulator between the source region and the drain region;
   a gate electrode having a first end on a side thereof closer to the source region than the drain region on a portion of the semiconductor substrate that is not covered with the first insulator, and having a second end on the first insulator closer to the drain region than the source region;
   a second insulator that is continuous with the second end of the gate electrode and having a portion which is on the first insulator where the first insulator is not covered with the gate electrode, is on an end of the drain region, and is in contact with the gate electrode, the first insulator, and the drain region;
   a third insulator on an end face of the first end of the gate electrode and on an end of the source region, wherein the third insulator includes a first layer made of silicon oxide, that contacts the gate electrode and the source region, a second layer made of silicon nitride, that contacts the first layer, and a third layer made of silicon oxide, that contacts the second layer; and
   an interlayer insulating film on the semiconductor substrate, the first insulator, the gate electrode, and the second insulator, wherein the interlayer insulating film does not contact the first insulator.

2. The semiconductor device according to claim 1, wherein
   the first insulator has a first end closer to the source region than the drain region, a second end closer to the drain region than the source region and a central part between the first and second ends, wherein the first and second ends are thinner than the central part.

3. The semiconductor device according to claim 2, wherein
   the first and second ends of the first insulator are progressively thinner with distance away from the central part.

4. The semiconductor device according to claim 1, wherein the second insulator includes
- a fourth layer made of silicon oxide, that contacts the gate electrode, the first insulator, and the drain region,
- a fifth layer made of silicon nitride, that is on the fourth layer, and
- a sixth layer made of silicon oxide, that is on the fifth layer.

5. The semiconductor device according to claim 1, wherein the source region and the drain region are of a first conductivity type, and the semiconductor substrate further includes
- a first semiconductor layer of a second conductivity type that contacts the source region, and
- a second semiconductor layer of the first conductivity type that contacts the drain region, the first insulator, and the first semiconductor layer.

\* \* \* \* \*